US008962977B2

(12) United States Patent
Nazeeruddin et al.

(10) Patent No.: US 8,962,977 B2
(45) Date of Patent: Feb. 24, 2015

(54) PHOTOELECTRIC CONVERSION DEVICES COMPRISING NOVEL LIGANDS AND SENSITIZERS

(75) Inventors: Mohammad Nazeeruddin, Ecublens (CH); Michael Graetzel, St-Sulpice (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 178 days.

(21) Appl. No.: 12/998,629

(22) PCT Filed: Nov. 11, 2009

(86) PCT No.: PCT/IB2009/055007
§ 371 (c)(1),
(2), (4) Date: Aug. 30, 2011

(87) PCT Pub. No.: WO2010/055470
PCT Pub. Date: May 20, 2010

(65) Prior Publication Data
US 2011/0303267 A1 Dec. 15, 2011

(30) Foreign Application Priority Data

Nov. 11, 2008 (EP) ..................................... 08105761

(51) Int. Cl.
| C07D 401/04 | (2006.01) |
| C07F 15/00 | (2006.01) |
| H01L 31/0224 | (2006.01) |
| H01L 31/02 | (2006.01) |
| H01L 51/00 | (2006.01) |
| H01L 51/42 | (2006.01) |

(52) U.S. Cl.
CPC ......... *H01L 51/0086* (2013.01); *H01L 51/4226* (2013.01); *Y02E 10/542* (2013.01); *Y02E 10/549* (2013.01)
USPC .............................. 136/254; 546/10; 546/257

(58) Field of Classification Search
USPC .................................................... 546/10, 257
See application file for complete search history.

(56) References Cited

FOREIGN PATENT DOCUMENTS

| EP | 1 985 669 A | 10/2008 |
| JP | 2004 296170 A | 10/2004 |
| WO | WO 2008075756 A1 * | 6/2008 |
| WO | WO 2008/102962 A | 8/2008 |
| WO | WO 2008/120810 A | 10/2008 |

OTHER PUBLICATIONS

Compound (CAS RN 1034049-96-1)_Jul. 17, 2008.*
Compound (CAS RN 880128-47-2)_Apr. 11, 2006.*
Klein et al.; Engineering of a Novel Ruthenium Sensitizer and Its Application in Dye-Sensitized Solar Cells for Conversion of Sunlight into Electricity; Inorganic Chemistry, vol. 44, Dec. 24, 2004, pp. 1778-180, XP002568025.
Houarner-Rassin et al.; Synthesis and Photoelectrochemical Properties of Ruthenium Bisterpyridirte Sensitizers Functionalized with a Thienyl Phosphonic Acid Moiety; Journal of Photochemistry and Photobiology, A: Chemistry, Elsevier Sequoia, Lausanne, CH vol. 192, No. 1 Oct. 19, 2007 XP022307062.
Dong et al.; New Efficiency Records for Stable Dye-Sensitized Solar Cells with Low-Volatility and Ionic Liquid Electrolytes, The Journal of Physical Chemistry C Letters; vol. 112, Nov. 10, 2008, pp. 17046-17050, XP002567504.
Feifei et al.; Enhance the Optical Absorptivity of Manocrystalline TiO2 film with High Molar Extinction Coefficient Ruthenium Sensitizers for High Performance Dye-Sensitized Solar Cells; Journal of the American Chemical Society, vol. 130, Jul. 22, 2008, pp. 10720-10728, XP002567503.
Jang et al.; Oligophenylenevinylene-Functionalized Ru (II)-bipyridine Sensitizers for Efficient Dye-Sensitized Nanocrystalline TiO2 Solar Cells; Chem. Mater., vol. 18 Oct. 19, 2006, pp. 5604-5608; XP002568026.
Bessho et al.; An Element of Surprise-Efficient Copper-Functionalized Dye-Sensitized Solar Cells; Chemical Communications, Jul. 8, 2008, pp. 3717-3719, XP002568027.
Nazeeruddin, Md. K., et al., Synthesis of Novel Ruthenium Sensitizers and Their Application in Dye-Sensitized Solar Cells, 2005, pp. 1460-1467, Elsevier B.V.
Klein, C. et al., Engineering of a Novel Ruthenium Sensitizer and Its Application in Dye-Sensitized Solar Cells for Conversion of Sunlight into Electricity, 2005, pp. 178-180, Inorganic Chemisty, vol. 44, No. 2, American Chemical Society.
Jang, Song-Rim, et al., High Molar Extinction Coefficient Ruthenium Sensitizers for Thin Film Dye-Sensitized Solar Cells, 2009, pp. 1998-2003, American Chemical Society.

* cited by examiner

*Primary Examiner* — Yong Chu
(74) *Attorney, Agent, or Firm* — Krieg DeVault LLP

(57) ABSTRACT

The present invention provides novel dyes for dye sensitized photovoltaic conversion devices. The dyes contain novel anchoring ligands, which have a vinyl or phenylethenyl moiety incorporated in the anchoring bipyridine. Such dyes exhibit an increased molar extinction coefficient and enhanced red response in the visible regions.

15 Claims, 2 Drawing Sheets

PHOTOELECTRIC CONVERSION DEVICES COMPRISING NOVEL LIGANDS AND SENSITIZERS

This application claims the benefits under 35 U.S.C. 119 (a)-(d) or (b), or 365(b) of International Application No. PCT/IB2009/055007 filed 11 Nov. 2009, and European Patent Application No. 08105761.4, filed 11 Nov. 2008.

TECHNICAL FIELD

The present invention relates to the field of photoelectric conversion devices, in particular photovoltaic cells. More particularly, the present invention relates to conversion devices comprising sensitising compounds, in particular sensitising dyes. The present invention relates to novel sensitising dyes for such conversion devices, to new ligands for use in such devices, and in particular to anchoring ligands of sensitising dyes useful to anchor the sensitising dye on the surface of a semiconductor and/or of a photoelectrode.

PRIOR ART AND THE PROBLEM UNDERLYING THE INVENTION

The function of the dye in dye-sensitised photoelectric conversion devices is to absorb more light and to use the absorbed light for charge separation, than if such a dye were absent. The dye plays a key role in such devices, as it affects not only the spectrum of absorbed light but also the molar extinction coefficient. Also the long-term stability of the device and the overall conversion efficiency. Therefore, the efforts of developing new dyes and thereby improving the properties of the overall conversion device have not slowed-down since B. O'Regan and M. Grätzel, Nature 1991, 353, 737-740 (EP 0333641 B1) drastically improved the conversion efficiencies of dye sensitised solar cells by providing nanocrystalline $TiO_2$, porous photoelectrode surfaces and ruthenium polypyridil complexes functioning as sensitising dyes. Since then, the focus of the dye development has been for compounds absorbing as much of the solar spectrum as possible and on the link between the dye and the semiconductor. In order to find the optimal system, a range of attaching functionalities have been screened, as disclosed, for example, in EP 0525070 and EP0758337. Despite considerable efforts, the original attaching ligand, 4,4'-dicarboxy-2,2'-bipyridine is still the state of the art.

Focus has later turned to sensitizing dyes that contribute to the long-term stability of such devices, for example, better resistance to water contained in trace amounts in the devices and better shielding of the Ti-electrode against corrosion through components present in the electrolyte, such as the triiodide/iodide couple (WO2006/010290 A1).

C. Klein et al., Inorganic Chemistry, Vol. 44, No. 2. 2005, report ligands in homoleptic dyes for dye sensitised solar cells, which bring an enhanced absorption in the red region of the visible spectrum. It is an objective to provide dyes with still better red response and communication of the electron transfer between the sensitizer and the semiconductor (generally TiO2)-electrode surface.

In view of the above, it is an objective to provide dyes for dye sensitised photoelectric conversion devices, which absorb a larger spectrum of solar light and exhibit a high molar extinction coefficient. Such dyes should preferably exhibit the very high or even higher electron injection speed into a semiconductor as previous dyes and generally have an improved communication and directionality of the electrons when being transferred from the sensitiser to the semiconductor electrode.

More specifically, it is the objective of the present invention to provide dyes that exhibit an enhanced red response when compared to prior art dyes.

It is an objective of the present invention to provide dyes that can be anchored and/or persistently attached to the semiconductor surface and/or to the surface of the photoelectrode. The attachment should be such that the dye stays attached over extended periods of several months and preferably years.

The present invention addresses the objectives defined above.

SUMMARY OF INVENTION

The present inventors provided new anchoring ligands that are part of dyes for dye sensitised photoelectric conversion devices. More specifically, the present inventors found that when the π-conjugation bridge between the anchoring group and the metal chromophore centre of such dyes is extended, the sensitizer exhibits enhanced red response and higher molar extinction coefficients when compared to prior art dyes. In particular, when one, two or more conjugated double bonds are provided in a conjugated relationship to the bipyridine structure, the latter forming the ligand to the metal centre, such compounds exhibit the reported properties. The use of such dyes results in cells with higher short-circuit photocurrent densities ($J_{SC}$), which is explained by said enhanced red response and higher molar extinction coefficients.

In a first aspect, the present invention concerns a compound of formula (I):

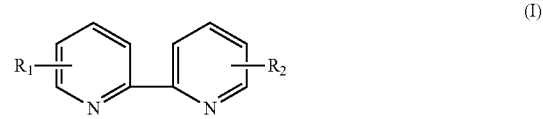

(I)

wherein $R_1$ and $R_2$ are, independently of each other, selected from substituents of formula (a)

(a)

wherein Co is is selected from (b) or (c):

(b)

(c)

wherein n is an integer of 1-4;

A is an optional aromatic moiety, which is, if present, selected from a C4-C18 aromatic ring or ring system, said aromatic moiety optionally comprising one or more heteroatoms, and wherein said aromatic moiety may be further substituted in addition to -Anc, with the proviso that if A is a C4 aromatic moiety it comprises one or more heteroatoms;

z is 0 or an integer selected from 1-3;

Anc is an anchoring group, which, if z=0, is attached by a single covalent bond to Co, and, if z is 1 or greater, is attached by a single covalent bond to A.

The anchoring group is preferably suitable to connect said ligand of formula (I) to an inorganic and/or to a semiconductor surface, in particular to semiconductor surfaces generally used in dye-sensitized solar cells, such as the electrodes mentioned further below. According to an embodiment, the anchoring group is selected from —COOH, —PO$_3$H$_2$, —PO$_4$H$_2$, —SO$_3$H$_2$, CONHOH$^-$, acetylacetonate, deprotonated forms of the aforementioned, salts of said deprotonated forms, and chelating groups with Π-conducting character.

In a second aspect, the present invention relates to the use of one or more compounds of formula (I) as a ligand of an organometallic compound. Said organometallic compound is preferably a dye and in particular a sensitising dye, more particularly a sensitising dye of a dye sensitised photoelectronic conversion device.

In a second aspect, the present invention provides an organometallic compound comprising a metal atom and, as a ligand to said metal atom, the compound of any one of formulae (I)-(XVI), disclosed herein.

In a third aspect, the present invention provides a photoelectric conversion device comprising a sensitising dye according to the present invention.

According to a preferred embodiment, the present invention relates to a dye for a dye-sensitised solar cell, wherein the dye comprises a ligand of formula (I) above, wherein, when z=0, Co is (c), and, if z=1 or larger, independently selected from (b) or (c). With such ligands, cells with higher efficiency are obtained, which may be explained, without wishing to be bound by theory, that the communication between the sensitiser and the photoelectrode is improved. As experiments show, a triple bond in the anchoring ligand, bridging the electron transfer from the metal to the photoelectrode surface, is particularly advantageous.

According to a preferred embodiment, the dye is a heteroleptic dye, comprising an anchoring ligand and a donor ligand, the latter being different from the first. In such dyes, further advantageous functionalities may be introduced, in particular hydrophobicity. Furthermore, directionality of the electron flow can be controlled and an enhanced molar extinction is observed.

DETAILED DESCRIPTION OF THE PREFERRED EMBODIMENTS

Figure 1:
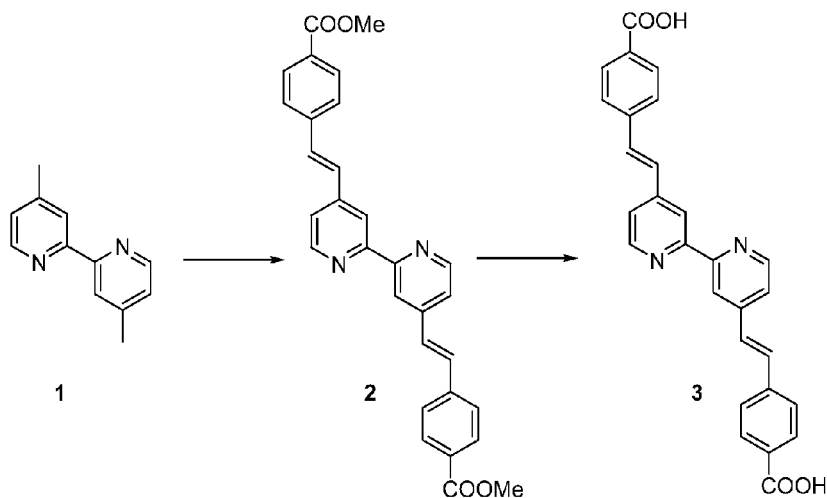
FIG. 1 illustrates the synthesis of novel ligands according to the invention.

The present invention relates to photoelectric conversion devices. The photoelectric conversion device is preferably a solar cell and/or a photovoltaic cell, capable of converting electromagnetic radiation, in particular visible, infrared and/or UV light, preferably sunlight, into electrical current.

According to an embodiment, the aromatic moiety A is a C5-C18 aromatic ring or ring system, said aromatic moiety optionally comprising one or more heteroatoms, and wherein said aromatic moiety may be further substituted in addition to -Anc.

In the compounds of formula (I), of the present invention, the bipyridine structure carries two substituents, R$_1$, R$_2$, selected from substituents of formula (a)

(a)

wherein the bond on the left side represents the connection by a carbon-carbon single bond to the bipyridine structure, and the bond on the right side represents the connection by a covalent single bond to the aromatic moiety A, as for example, illustrated by the formula (a.1) below, or, if A is absent, to an anchoring group Anc.

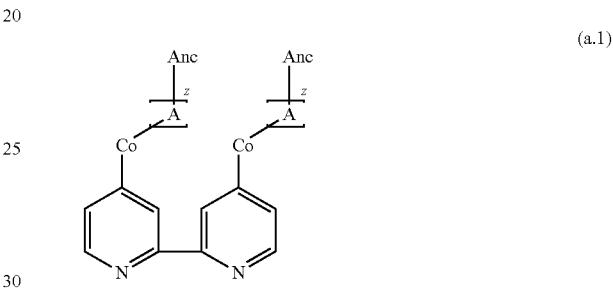

(a.1)

Co represents a conjugated system selected from the moieties (b) or (c) below.

wherein the bond on the left side of each of (b) and (c) represents the single bond to the bipyridine structure and the bond on the right side represents the bond to the aromatic structure A of the compounds of formula (a) and/or (a.1), or, if A is absent (z=0), to the anchoring group Anc. In other words, moieties (b) and (c) are bivalent moieties, wherein the left and right end-points of the bonds can be interpreted as carbon atoms of the bipyridine and the aromatic moiety (or, if z=0, a carbon of the anchoring group), respectively, or they can be interpreted as radicals (-diyl), forming a single bond by connection with a radical present on a carbon atom of the bipyridine or the aromatic moiety (or, if z=0, a radical present on the anchoring group), respectively. The structure of the resulting compounds is identical, with both interpretations of the moieties (b) and (c). According to the radical interpretation, n being 1, moiety (b) is vinylene (ethenediyl), if n=2 (b) is bivinylene, and so forth. For further illustration, with n=1, moiety (c) is ethindiyl. This explanation applies to further formulae herein, where a moiety is connected at two positions by separate covalent single bonds to another moiety.

Small n is an integer selected from 1-4, preferably 1-3, more preferably 1 or 2 and most preferably 1.

A is an aromatic moiety that is covalently bound, with one of its carbons in a conjugated manner to one of the substituents (b) and (c), and with another carbon to the anchoring group Anc.

An "aromatic moiety", for the purpose of the present specification, for example the aromatic moiety A or $A_1$, may be substituted and may comprise one or more heteroatoms. The aromatic moiety may comprise one or more rings, for example, one, two, three or four rings, which may be fused with each other. The aromatic moiety preferably includes from 4 to 22 carbons, with the proviso, that at least one (but possibly two or even more) heteroatom must be present if the aromatic moiety is an aromatic ring comprising only 4 carbons (for example, if A is thiophene, furane, or pyrrol). If A comprises 5 carbons, there also may be one (or more) heteroatoms), or A (or $A_1$) is cyclopentadienyl. Thiophene, for example, is considered as a C4-aryl with one atom of the 5-membered ring being a sulfur heteroatom.

Heteroatoms in A or $A_1$ are preferably selected from one or more selected from S, O, and N.

Preferably, the aromatic moiety is a C5-C18, more preferably a C6-C12 and most preferably a C6-C10 compound. The aromatic moiety may be derived from aromatic compounds selected from the group of benzene, pentalene, indene, naphtaline, azulene, anthracene, phenantrene, fluorine, biphenylene, for example. Examples of aromatics with heteroatoms include thiophene, furane, pyridine, purine, pyrazine, pyrimidine, pyridazine. For example, if the aromatic moiety (A or $A_1$, for example) is benzene, A in formulae (a) or (a.1) and in the formulae below, or $A_1$ discussed further below, is phenylene. If A or $A_1$ is phenylene, it may be ortho, meta or para-phenylene. Preferably, A is para-phenylene.

Substituents of the aromatic moiety A may be a hydrocarbon of 1-10 carbons and which hydrocarbon may comprise one or more heteroatoms, preferably selected from, independently one from the other O, P, N, S, and halogen. For example, substituents may comprise a linear hydrocarbon chain, interrupted by one or more oxygen and/or sulfur atoms, or both thereby forming an ether, polyether, thioether, polythioether, for example. The substituents may be substituted by functional groups, for example amino, hydroxy, keto, carboxy groups. They may comprise one or more double or triple bonds. Preferred substituents are halogens, C1-C10 alkyl, C1-C10 alkoxy.

For the purpose of the present invention, an "alkyl" may be linear, branched and/or cyclic. Preferably, an alkyl according to the present specification comprises 1-20, more preferably 1-10, even more preferably 1-6 and most preferably 1-4 carbons, for example 1, 2, 3 or 4 carbons.

In the formulae herein z represents the number of aromatic moieties that are provided. Since the aromatic moiety is only optional, z may be 0, or may be selected from an integer of 1-3. Preferably, z is 1.

Anc is an anchoring group attached by a single, covalent bond to the aromatic moiety A, or if z=0, directly to the one of the moieties selected from (b) and (c). Anchoring groups as such have already been reported in the literature. They be selected from —COOH, —$PO_3H_2$, —$PO_4H_2$, —$SO_3H_2$, $CONHOH^-$, acetylacetonate, deprotonated forms of the aforementioned, salts of said deprotonated forms, and chelating groups with Π-conducting character, for example.

The anchoring group has the purpose of attaching the compound of the present invention, and with it, the organometallic complex containing the compound as a ligand, to a desired structure, generally a surface, of the device of the present invention. In this way, the compound and with it, the organometallic complex, is permanently connected to the designated surface structure. Preferably, the designated surface structure is a semi-conductor surface. Preferably, the designated surface structure is an electrode, more preferably a photoelectrode and/or a photoanode. According to a preferred embodiment, the designated surface to which the compound of the invention is bound is a nanochristalline, porous semiconductor surface, for example a $SnO_2$, ZnO. $Nb_2O_5$ and $TiO_2$ surface.

An example of an anchoring group is acetylacetonate of formula (Anc1) below, wherein Anc1 is connected to the aromatic moiety or the moieties (b) and (c) as detailed above by a covalent bond to one selected from carbon 1, 3 or 5, preferably carbon 3, as highlighted in the compound of formula (Anc1):

(Anc1)

As the skilled person appreciates, the keto and enol tautomeric forms of the anchoring group Anc1 coexist in solution, which are thus both encompassed by the present invention.

Salts of the deprotonated forms of the above anchoring groups may be selected from salts of organic or an organic cations. Preferably the salt is selected from a H+, Na+, Li+ or ammonium salt of the above compound.

Anchoring groups Anc comprising a chelating group with π-conducting character, besides acetylacetonate, include oxyme, dioxyme, hydroxyquinoline, salicylate or an α-ketoenolate group in general (like acetylacetonate).

Preferred anchoring groups are selected from —COOH, acetylacetonate, the deprotonated form of the aforementioned and of salts as defined above of the deprotonated from.

According to a preferred embodiment, the compound of the present invention is selected from compounds of formulae (II) and (III) below:

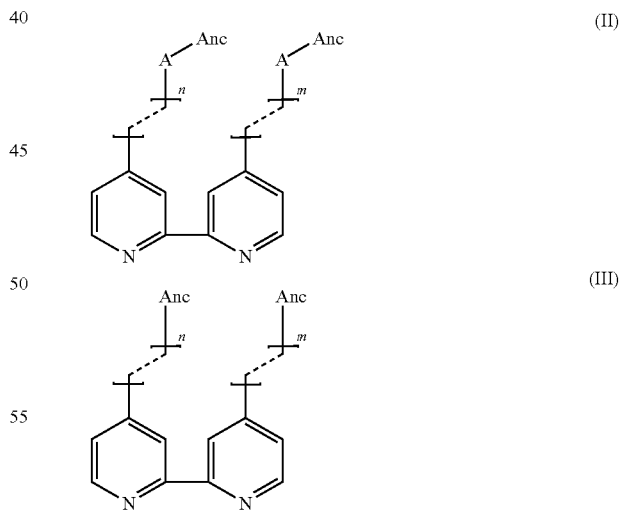

wherein, the dotted line represents a carbon-carbon double or triple bond, n and m are, independently of each other, an integer selected from 1, 2, 3 or 4, and A in formula (II) is a mandatory aromatic moiety, the aromatic moiety being defined as above and Anc is as defined above. Preferably, n is 1 or 2. In (III), the dotted line, with n and m being 1, is preferably a triple bond.

According to a further embodiment, the compound of formula (II) is a compound of formula (IV) below:

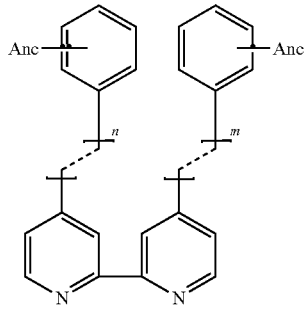

(IV)

wherein Anc, n, and m and the dotted line are as defined above.

According to a preferred embodiment, the compound of formula (I) is selected from any one of the compounds of formulae (V) and (VI) below:

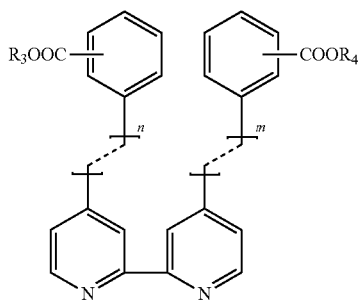

(V)

(VI)

wherein $R_3$ and $R_4$ are selected, independently of each other, of $H^+$, an inorganic cation, and of an organic cation. The cation is preferably a monovalent cation, such as H+, Na+ or Li+.

According to a preferred embodiment, the compound of formula (I) is selected from any one of the compounds of formulae (VII), (VIII), (IX) and (X) below:

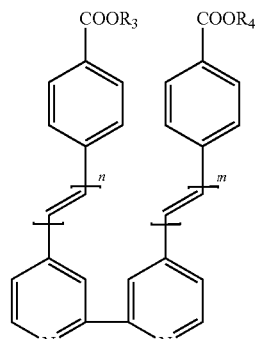

(VII)

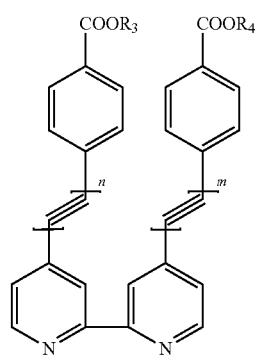

(VIII)

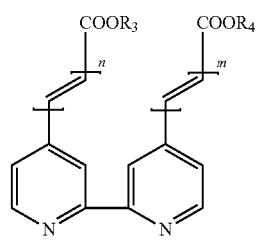

(IX)

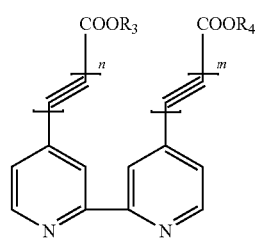

(X)

wherein $R_3$, $R_4$, n and m are as defined above.

In the compound of formulae (II)-(X) above, n and m are integers of 1-3, more preferably 1 or 2 and most preferably 1. Preferably, n and m are identical.

According to an embodiment, in the compound of formulae (V)-(XIV) (see also below), $R_3$, $R_4$, are preferably identical. Preferably, they are H+, or absent, in case of the deprotonated form of these compounds, the latter then being negatively charged.

According to a preferred embodiment, the compound of formula (I) is selected from any one of the compounds of formulae (XI)-(XIV) below:

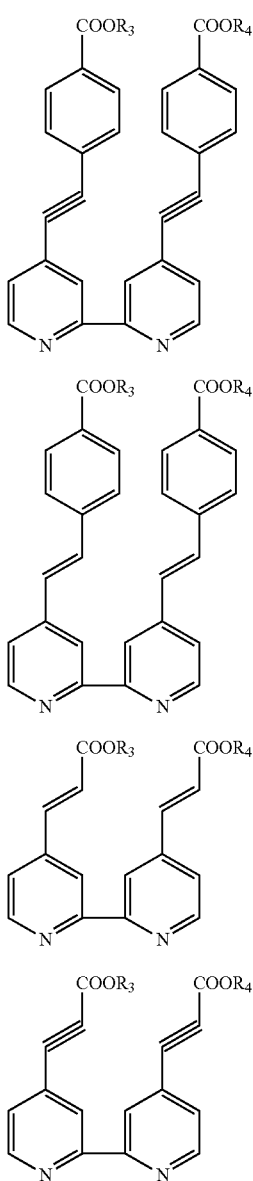

(XI)

(XII)

(XIII)

(XIV)

wherein $R_3$ and $R_4$ are as defined above.

The present invention preferably relates to a dye comprising at least one metal atom and, as a ligand to said metal atom, at least one compound of any one of formulae (I)-(XIV) above. Preferably, the dyes of the invention comprise only one anchoring ligands of formula (I)-(XIV) above.

According to a preferred embodiment, the dyes of the present invention are heteroleptic, that is, they have an anchoring ligand and one different ligand, generally a donating ligand.

Accordingly, in the dyes of the invention AL and DL are preferably different from each other. The spectator ligands are not considered for the determination if a dye is heteroleptic, since they are almost in all cases different from the anchoring ligands.

Accordingly, the compounds of any one of formulae (I)-(XIV) above are used as a ligand in an organometallic complex. The organometallic complex is preferably a dye, more preferably a sensitising dye. The dye preferably is a sensitising dye.

The at least one metal atom of said dye may be selected, for example, from one or more of ruthenium, osmium, platinum, iron and copper. Preferably, the dye has one metal atom. Preferably, said metal atom is ruthenium.

According to another embodiment, the organometallic complex of the present invention comprises at least one further ligand to said metal atom, said further ligand being selected from ligands of formula (XX):

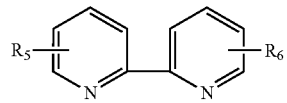

(XX)

wherein $R_5$ and $R_6$ are selected, independently one from the other, from substituents of formula (f) below:

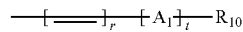

(f)

wherein:

r is 0, 1 or 2; t is 0 or an integer from 1-3;

$A_1$ is a C4-C18 aromatic moiety, which, besides $R_{10}$, may be further substituted and which may comprise one or more heteroatoms, with the proviso that if $A_1$ is a C4 aromatic moiety, it comprises one or more heteroatoms; and, $R_{10}$ is H or a C1-C18 hydrocarbon, which may comprise one or more heteroatoms According to an embodiment, at least one of $A_1$ and $R_{10}$ comprise at least one electron pair donating group.

An electron pair donating group is a moiety or group that comprises a free electron pair. The electron pair donating group comprises one or more heteroatoms selected from O, S, and N.

Amines, hydroxy groups, thiol groups, ether and thioether functionalities are examples of groups that contain electron pair donating groups.

According to an embodiment, $A_1$ has the same definition as A discussed above and the same indications made for A also apply to $A_1$ and vice versa.

According to an embodiment, $A_1$ is a C5-C18 aromatic moiety, which, besides $R_{10}$, may be further substituted and which may comprise one or more heteroatoms.

According to an embodiment, said electron pair donating group is selected from an ether (—O—) and a thioether (—S—) functionality, or both.

According to a preferred embodiment, the substituent -$[A_1]_t$-$R_{10}$ of the ligand of formula (XX) is selected from a substituent of formula (g) and (h) below:

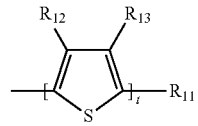

(g)

-continued

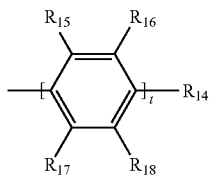
(h)

wherein:

t is as defined above;

$R_{11}$-$R_{13}$ are, independently one from the other(s) selected from H and C1-C10 hydrocarbons, optionally comprising one or more heteroatoms, wherein $R_{12}$ and $R_{13}$ may be connected to form a ring fused to the thiophene ring.

$R_{14}$-$R_{18}$ are, independently from one another, selected from H and C1-C10 hydrocarbons, optionally comprising one or more heteroatoms. Preferably, at least one selected from $R_{14}$-$R_{18}$ comprises an electron pair donating group comprising at least one heteroatom.

Preferably, substituents $R_{11}$-$R_{18}$ are preferably selected, independently one from the other, H and alkyls as defined above, more preferably C1-C5 alkyls, with the proviso that at least one of $R_{14}$-$R_{18}$ comprises an electron pair donating group comprising at least one heteroatom.

Preferably, one of $R_{14}$-$R_{18}$, preferably $R_{14}$, is alkoxy and/or comprises an ether or thioether function within a linear hydrocarbon.

According to an embodiment of the ligand of formula (XX), $R_5$ and $R_6$ are, independently one from the other, selected from substituents of formulae (i), (j), and (k):

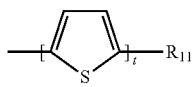
(i)

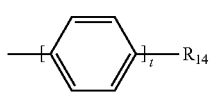
(j)

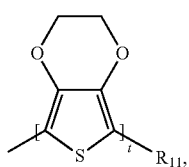
(k)

wherein $R_{11}$, and $R_{14}$ are as defined above. Preferably, $R_{14}$ comprises at least one electron pair donating group.

According to an embodiment, the ligand of formula (XX) is selected from any one of formulae (XXI), (X) and (XOH) below:

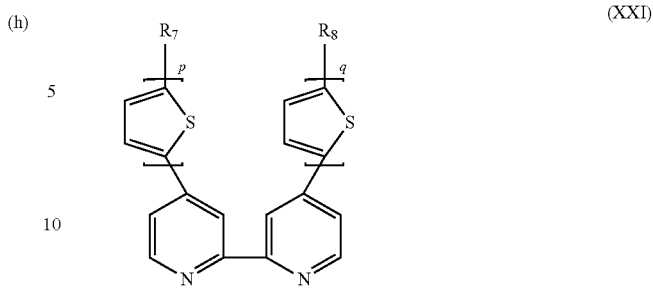
(XXI)

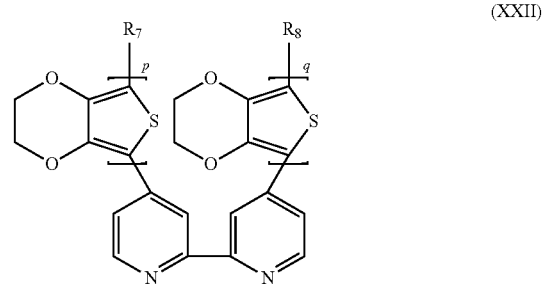
(XXII)

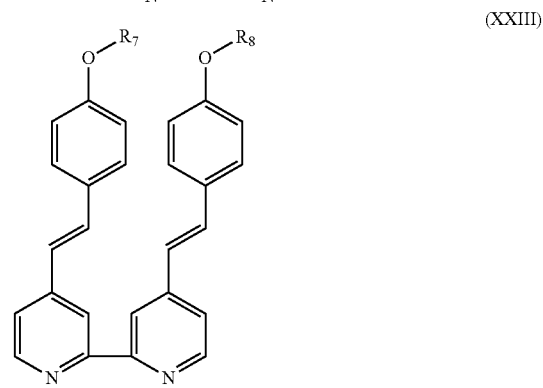
(XXIII)

wherein $R_7$ and $R_8$ are selected, independently one from the other, from H and C1-C5 hydrocarbon, preferably C1-C3 hydrocarbon. $R_7$ and $R_8$ may comprise one or more heteroatoms as defined above, but preferably are C1-C5, more preferably C1-C3 alkyls. Preferably, $R_7$ and $R_8$ are identical.

According to a preferred embodiment, the sensitizing dye of the present invention has the formula (XXV):

$$M(AL)(DL)(SL)_Y \quad (XXV)$$

wherein,

M is a metal selected from ruthenium, osmium, platinum, iron and copper, and preferably selected from ruthenium and osmium;

AL is an anchoring ligand selected from compounds according to any one of formulae (I)-(XIV) as defined above;

DL is a donor ligand selected from compounds according to any one of formulae (XX)-(XXIII) as defined above;

y is 1 or 2 and SL is a spectator ligand, which, with y being 2, are selected independently from two monodentate anionic ligands and, with z being 1, is a bidentate monoanionic ligand.

Figure 2:
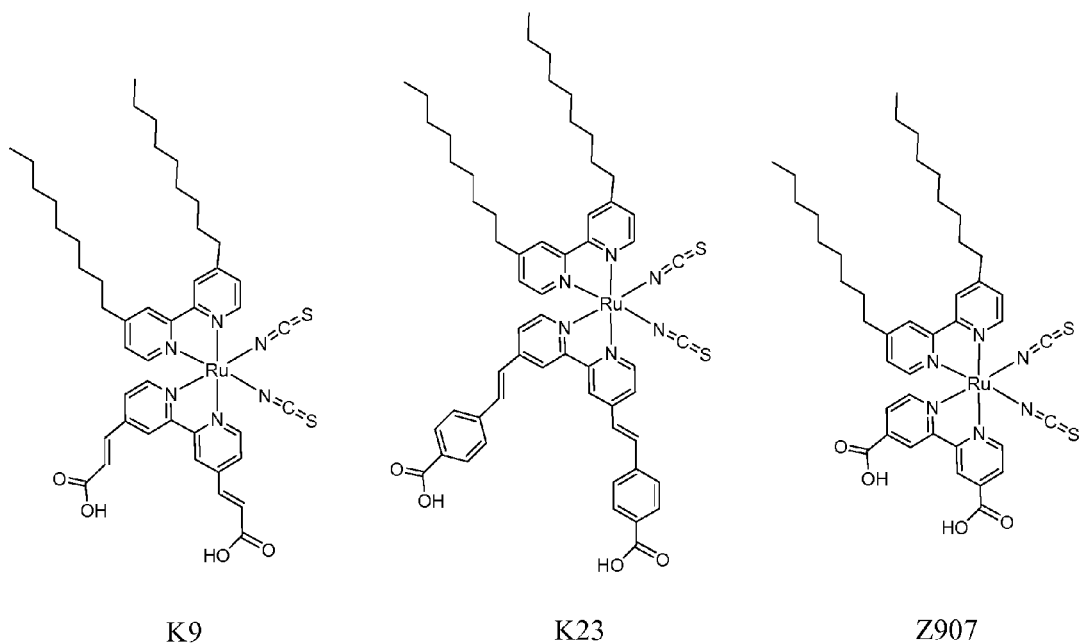
FIG. 2 shows the chemical structure of dyes according to the present invention K9 and K23, which out-performed prior art dye Z907, as detailed in the examples.

Examples of monodentate anionic ligands are halogen anions, such as Cl⁻, CNS⁻ and CN⁻. In the sensitising dyes shown in FIG. 2, CNS⁻ is used as a spectator ligand SL.

Examples of bidentate monoanionic ligands are dithiocarbamate, acetylacetone, phenylpyridines of formula (XXX) below:

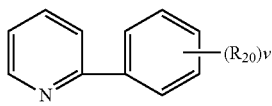

(XXX)

wherein $R_{20}$ represents a halogen atom and v is 0 or an integer of 1-3. If v=0, the compound of formula (XXX) is 2-phenylpyridine. Examples with the phenyl substituent being substituted with two halogen include 2-(2,4-difluorophenyl)pyridine, 2-(2,4-dichlorophenyl)pyridine, and 2-(2,4-dibromophenyl)pyridine. These compounds are represented by formula (XXXI) below:

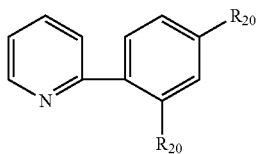

(XXXI)

The organometallic compounds disclosed herein are useful as sensitising dyes of DSSCs (Dye Sensitised Solar Cells).

The present invention further concerns a photoelectric conversion device comprising a metal complex comprising a ligand of formula (I) and/or of the embodiments of this ligand described above. Preferably, the photoelectric conversion device comprises a sensitising dye as defined herein above.

According to a preferred embodiment, the photoelectric conversion device of the invention is a dye sensitised photovoltaic cell or solar cell (DSSC).

Preferably, the sensitising dye of the DSSC comprises a ligand of formula (I) as defined herein, and/or of one of the embodiments of formulae (II)-(XIV).

Preferably, the photoelectric conversion device is a regenerative cell, preferably a regenerative DSSC.

According to an embodiment, the photoelectric conversion device comprises a photoelectrode, a counter electrode and, between the photoelectrode and the counterelectrode, an electrolyte or a charge transporting material, and wherein a dye according to the invention is absorbed on the surface of the photoelectrode, on the side facing the counterelectrode. The photoelectrode preferably comprises a nanocrystalline, porous layer of a semiconductor material, said porous layer being characterized by a roughness factor of larger than 20, preferably larger than 200 and even larger than 1000. Preferably, the photoelectrode is a photoanode. The photoelectrode and the counterelectrode are preferably provided on support substrates, such as transparent glass or plastic, at least one of which is transparent.

Electrode (photo- and counterelectrode) materials, and electrolytes that are suitable for the present invention are disclosed in EP1507307, WO2006/010290, WO2007/093961, and in many more. Devices containing electrically conductive charge transporting materials are disclosed in WO2007/107961. In the above references, the manufacturing of such devices is also disclosed. In FIG. 1 of EP1507307, an embodiment of a possible structure of devices of the present invention is disclosed. On page 8, line 10 to page 9, line 51, general information and suitable materials of the preparation of devices encompassed by the present invention is disclosed. Of course, the present invention is not limited to devices as disclosed in these references.

The invention is illustrated by the Examples below, which are not intended to limit the scope of the invention.

EXAMPLES

Methodology

Analytical Measurements:

UV/Vis and fluorescence spectra were recorded in 1 cm path length quartz cell on a Cary 5 spectrophotometer and Spex Fluorolog 112 Spectroflurimeter, respectively. Electrochemical data were obtained by cyclic voltammetry in a conventional three-electrode cell with a PAR potentiostat. A glassy-carbon or a gold working electrode, platinum-wire auxiliary electrode and saturated silver chloride electrodes were used in a single-compartment-cell configuration. $^1$H and $^{13}$C NMR spectra were measured on a Bruker 200 MHz spectrometer. The reported chemical shifts were in PPM against TMS. The ATR-FTIR spectra for all the samples were measured using a Digilab 7000 FTIR spectrometer. The ATR data reported here was taken with the 'Golden Gate' diamond anvil ATR accessory (Graseby-Specac) using typically 64 scans at a resolution of 2 $cm^{-1}$. The IR optical bench was flushed with dry air.

Materials:

The solvents and reagents puriss grade quality were purchased from Fluka. 4,4'-dinonyl-2,2'-bipyridine (dnbpy), dichloro(p-cymene)ruthenium(II) dimer and potassium/ammonium thiocyanate were obtained (from Aldrich) and used as received. LH-20 Sephadex gel was obtained from Pharmacia. The intermediate product 4,4'-diformyl-2,2'-bipyridine, 4,4'-bis(carboxyvinyl)-2,2'-bipyridine ligand and its heteroleptic ruthenium complex (K9) were synthesized according to literature procedures (Nazeeruddin M K, Klein C, Liska P, et al., Synthesis of novel ruthenium sensitizers and their application in dye-sensitized solar cells, Conference Information: 15th International Symposium on Photochemistry and Photophysics of Coordination Compounds, Jul. 4-9, 2004 Hong Kong, PEOPLES R CHINA; COORDINATION CHEMISTRY REVIEWS, Volume 249, Issue 13-14, pages 1460-1467, published in July 2005).

Example 1

Synthesis of 4,4'-di(carboxyvinyl)-2,2'-bipyridine or 4,4'-dicarboxy(phenylethenyl)-2,2'-bipyridine 4,4'-Dimethyl-2,2'-bipyridine and methyl 4-formylbenzoate were purchased from Aldrich and Fluka respectively. 4,4'-Di(phenylethenyl)-2,2'-bipyridine 3 was prepared by hydrolysis of the styryl ester 2, which was synthesized from 4,4'-Dimethyl-2,2'-bipyridine 1 by a modified version of the previously described procedure (see Klein et al., 2005 below) as follows: 4,4'-Dimethyl-2,2'-bipyridine (11.054 g, 0.06 mol) and methyl 4-formylbenzoate (29.549 g, 0.18 mol) were dispersed in acetic anhydride (16 mL) then dry potassium acetate (5.889, 0.06 mol) and iodine (50 mg, $2\times10^{-4}$ mol) were added. The resulting mixture was heated under reflux for 48 h. After cooling, methanol (200 mL) was added and the resulting fine off-white crystals were filtered off. The solid was stirred for 5 minutes with boiling methoxyethanol (400 mL), the mixture allowed to cool to RT, and the crystalline product filtered off and dried to give pure styryl ester (19.449 g, 72%). The compound gave spectroscopic data identical to that previously reported. 4,4'-Dicarboxy(phenylethenyl)-2,2'-bipyridine 3 was then obtained in quantitative yield from the styryl ester according to the literature procedure. (Engineering of a Novel Ruthenium Sensitizer and its Application in Dye-Sensitized Solar Cells for Conversion of Sunlight into Electricity, C. Klein, Md. K. Nazeeruddin P. Liska, Davide Di Censo, N. Hirata, E. Palomares, J. R. Durrant and M. Grätzel, Inorg. Chem. 44, 178-180, 2005).

Example 2

Synthesis of Ruthenium Complex K23

The complex K23 was synthesized by refluxing a mixture of 4,4'-dinonyl-2,2'-bipyridine (150 mg, 0.37 mmol) and dichloro(p-cymene)ruthenium(II) dimer (113 mg, 0.18 mmol) in argon degassed absolute ethanol (40 mL) for 4 h. Evaporation of the solvent leaded to dichloro(p-cymene)-4,4'-dinonyl-2,2'-bipyridine-ruthenium(II) complex as a brow-yellow oil in a quantitative yield. This intermediate complex was used without further purification for reacting with 4,4'-dicarboxy(phenylethenyl)-2,2'-bipyridine (0.36 mmol) in dry and argon degassed DMF (30 mL). The mixture was heated at 150° C. for 4 h and to the resulting dark purple solution was added $NH_4NCS$ (408 mg, 5.4 mmol) and the mixture heated at 150° C. for 4 h more. After evaporation of the DMF, the resulting purple residue was suspended in water (200 mL) and sonicated for 5 min. The pH was adjusted to 3 with $HNO_3$ (0.02 M) and the mixture was let stand in the fridge overnight. The crude complex was dissolved in methanol containing two equivalents of tetrabutylammonium hydroxide. The concentrated solution was filtered through a sintered glass crucible and charged onto a LH-20 Sephadex column, which was prepared in methanol. The adsorbed complex was eluted using methanol as an eluent. The main band was collected and the solution pH was lowered to 3 using 0.02 M $HNO_3$ acid. The precipitated complex was collected on a glass fit and air-dried. Yield 60 mg, 32%. The analytical and spectroscopic data are consistent with the structures shown in FIG. 2.

Example 3

Preparation of Mesoscopic $TiO_2$ Films

Fluorine-doped $SnO_2$ conducting (FTO) glass plates (Nippon Sheet Glass, 4 mm thick, 8 Ω/sq) were cleaned in a detergent solution, rinsed with water and ethanol, and then treated in a UV-$O_3$ system for 20 min in order to remove organics or contaminations. The cleaned plates were treated with a 40 mM $TiCl_4$ aqueous solution at 70° C. for 30 min to facilitate a good mechanical contact between the following printed $TiO_2$ layer and the conducting glass matrix. Next, the transparent film of 20 nm sized $TiO_2$ particles was screen-printed on the treated conducting glass, as disclosed in the publications of Nazeeruddin et al., 2001, and Wang et al., 2003 below. A thicker transparent $TiO_2$ layer can be obtained by repeating the screen printing operation. In this research, 2.6 and 4.4 μm thickness films as the transparent film and 1.8, 2.5, 5.5, 7.0 and 10 μm thickness films as the double-layer films were used. An 5 μm light scattering layer of 400 nm anatase particles (CCIC, HPW-400) was also coated on the transparent films. The electrodes coated with the $TiO_2$ pastes were gradually heated under an air flow at 325° C. for 5 min, at 375° C. for 5 min, at 450° C. for 15 min and at 500° C. for 15 min. These electrodes were again treated with $TiCl_4$ and heated to 70° C. for 30 min.

Example 4

Fabrication of Dye-Sensitized Solar Cells

The sintered $TiO_2$ electrodes prepared in Example 3 were heated at 500° C. for 30 min and cooled to about 80° C. Then, they were immersed into the dye solution at room temperature for 17 h. The sensitizing dye solution contained 0.3 mM K9 or K23 in acetonitrile and tert-butyl alcohol (volume ratio=1:1). The counter electrodes were prepared by coating an FTO plate (TEC 15, 2.2 mm thickness, Libbey-Owens-Ford Industries) with a drop of $H_2PtCl_6$ solution (2 mg Pt in 1 ml ethanol) and heating it at 430° C. for 15 min. The dye-coated $TiO_2$ electrode and Pt counter electrode were assembled into a sealed sandwich type cell by heating with a hot-melt ionomer film (Surlyn 1702, 25 μm thickness, Du-Pont) as a spacer between the electrodes. A drop of the electrolyte solution that consists of 0.6 M 1-butyl-3-methyl imidiazolium iodide (BMII), 0.05 M iodine ($I_2$), 0.1 M LiI and 0.5 M tert-butylpyridine (TBP) in a mixture of acetonitrile/valeronitrile (85:15, v/v) labelled as A7117 was incorporated as previously described method (Nazeeruddin, Md. K., Pechy, P., Renouard, T., Zakeeruddin, S. M., Humphry-Baker, R., Comte, P., Liska, P., Cevey, L., Costa, E., Shklover, V., Spiccia, L., Deacon, G. B., Bignozzi, C. A., Grätzel, M. *J. Am. Chem. Soc.* 2001, 123, 1613; Wang, P., Zakeeruddin, S. M., Comte, P.; Charvet, R., Humphry-Baker, R., Grätzel, M. *J. Phys. Chem. B* 2003, 107, 14336).

Measurements

For photocurrent-voltage measurements of the DSSCs, the irradiation source was a 450 W xenon light source (Osram XBO 450, USA), whose power was equivalent to an AM 1.5 solar simulator and was calibrated by using a Tempax 113 solar filter (Schott). The output power of the AM 1.5 solar simulator was calibrated by using a reference Si photodiode equipped with a coloured matched IR-cutoff filter (KG-3, Schott) in order to reduce the mismatch in the region of 350-750 nm between the simulated light and AM 1.5 to less than 2%. The measurement delay time of photo I-V characteristics of DSCs was fixed to 40 ms. The measurement of incident photon-to-current conversion efficiency (IPCE) was plotted as a function of excitation wavelength by using the incident light from a 300 W xenon lamp (ILC Technology, USA), which was focused through a Gemini-180 double monochromator (Jobin Yvon Ltd.).

Photo-generated transients were observed by using an exciting pulse generated by red light emitting diodes with a white light bias. Photovoltage transients were observed by using a pump pulse generated by 4 red light emitting diodes controlled by a fast solid-state switch. Pulse widths of 50 μs were used, with a rise and fall time of ≤2 μs. The pulse of red light was incident on the photoanode side of the cell, and its intensity was controlled to keep the modulation of the voltage below 10 mV. The bias light, composed of five 10 W "Solarc" lamps (WelchAllyn), was incident on the same side and was attenuated when needed by neutral density filters. From the current decay the photo generated charge in the cell is measured. The corresponding voltage decay gives the electron lifetime. Desorption of dyes was effected from 0.27 $cm^2$ $TiO_2$ films (2.5+5.5 μm) into 3 mL of 10 mM tetrabutyl ammonium hydroxide (TBAOH) in ethanol.

Results and Discussion

Figure 3:
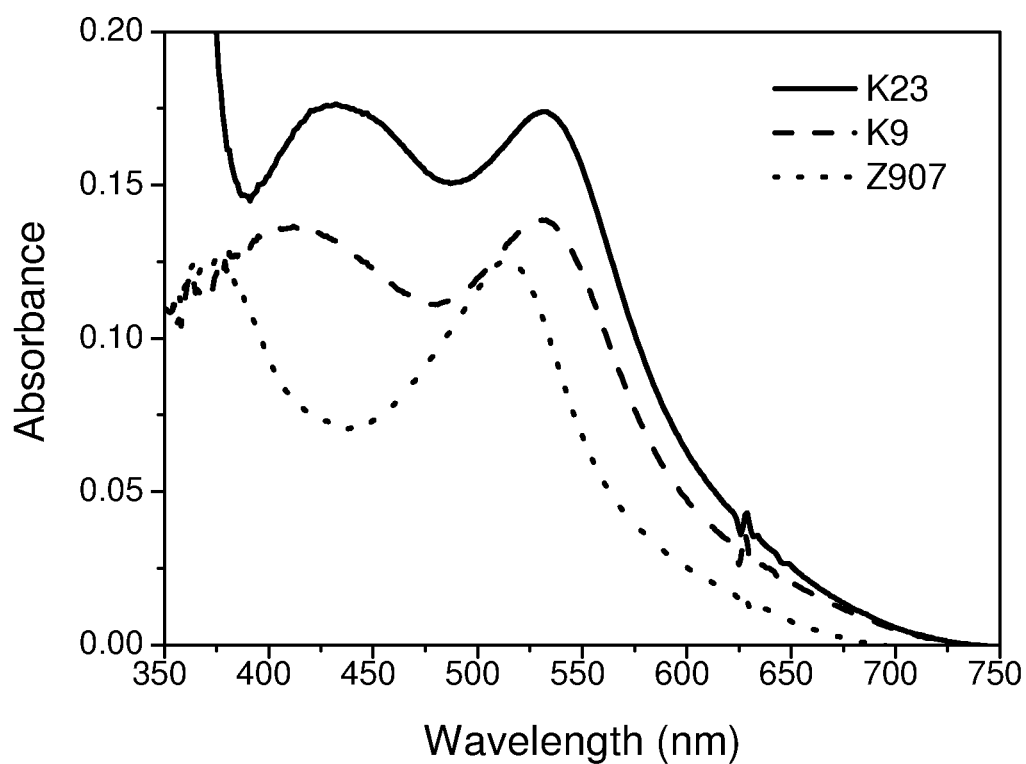
FIG. 3 shows UV-vis spectra of 1×10$^{-5}$ M each of Z907, K9 and K23 sensitizers in EtOH. K9 and K23 are dyes according to the present invention; Z907 is a comparable state of the art dye. The dyes of the invention differ only with respect to the ligand with the anchoring group from the state of the art dyes.

FIG. 3 shows UV-Vis (Ultraviolet-Visible) absorption spectra of $1\times10^{-5}$ M each of the K9 and K23 sensitizers as compared with the Z907 sensitizer in ethanol. The absorption spectra of the K9 and K23 sensitizers are dominated by metal to ligand charge transfer transitions (MLCT), which are located at 462 and 529 nm, and 446 and 534 nm, respectively (Table 1).

The peak positions of the lowest energy MLCT band of the K9 and K23 sensitizers are red shifted by 13 nm and 18 nm, respectively, when compared with the Z907 sensitizer, and the molar extinction coefficients at the peak wavelengths of the new sensitizers are higher by 15% and 38%, respectively. Without wishing to be bound by theory, it is believed that the increased π-conjugation lengths of 4,4'-bis(carboxyvinyl)-2,2'-bipyridine in K9 and 4,4'-bis((carboxyphenyl)ethenyl)-2,2'-bipyridine in K23 are responsible for the increased molar extinction coefficients in the visible region as compared with Z907 sensitizer. The high-energy bands below 350 nm are due to ligand π-π* transitions.

TABLE 1

Comparison of absorption peaks and molar absorption coefficients of the synthesized sensitizers K9 and K23 with Z907.

| Sensitizer[a] | $\lambda_{max}$ (nm), [$\epsilon_{max}$ ($10^4$ $M^{-1}$ $cm^{-1}$)] |
|---|---|
| Z907 | 375 (1.24), 515 (1.26) |
| K9 | 413 (1.35), 530 (1.38) |
| K23 | 433 (1.75), 533 (1.74) |

[a]Measured in ethanol

The invention claimed is:

1. A sensitising dye being a heteroleptic dye and comprising a metal atom selected from ruthenium, osmium, platinum, iron and copper,
a compound of formula (a.1) as a ligand to said metal atom:

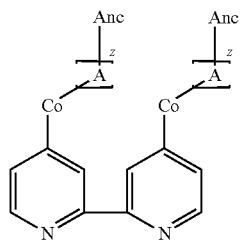

(a.1)

wherein Co is independently selected from (b) or (c):

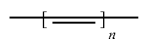

(b)

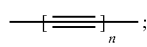

(c)

wherein n is independently an integer of 1-4;
A is an aromatic moiety, which is selected from a C6-C12 aromatic ring or ring system, said aromatic moiety optionally comprising one or more heteroatoms, and wherein said aromatic moiety may be further substituted in addition to -Anc;
z is an integer selected from 1-3;
Anc is an anchoring group being attached by a single covalent bond to A, wherein Anc is selected from —COOH, —PO$_3$H$_2$, —PO$_4$H$_2$, —SO$_3$H$_2$, CONHOH, acetylacetonate, deprotonated forms of the aforementioned, salts of said deprotonated forms, and chelating groups with Π-conducting character, and at least one further ligand to said metal atom, said further ligand being selected from ligands of formula (XX):

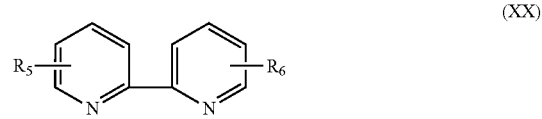

(XX)

wherein R$_5$ and R$_6$ are selected, independently one from the other, from substituents of formula (f) below:

(f)

wherein r is 0, 1 or 2; t is 0 or an integer from 1-3;
A$_1$ is a C4-C18 aromatic moiety, which, besides R$_{10}$, may be further substituted and which may comprise one or more heteroatoms, with the proviso that if A$_1$ is a C4 aromatic moiety, it comprises one or more heteroatoms; and,
R$_{10}$ is H or a C1-C18 hydrocarbon, which may comprise one heteroatom;
with the proviso that only the C4 position of each pyridine ring of ligand of formula (XX) is substituted by R$_5$ and R$_6$, respectively.

2. The sensitising dye of claim 1, wherein said compound of formula (a.1) is a compound of formula (II):

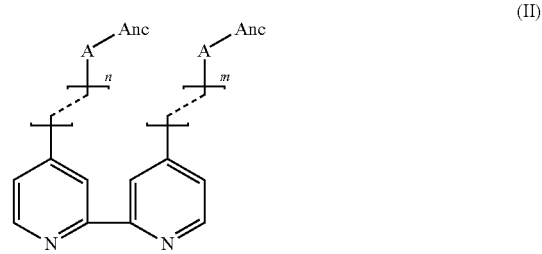

(II)

wherein, the dotted line represents a carbon-carbon double or triple bond, n and m are, independently of each other, an integer selected from 1, 2, 3 or 4, and
wherein A in formula (II) is an aromatic moiety selected from a C6-C12 aromatic ring or ring system, said aromatic moiety optionally comprising one or more heteroatoms, and wherein said aromatic moiety may be further substituted in addition to -Anc; and Anc is an anchoring group being attached by a single covalent bond to A, the anchoring group Anc being selected from —COOH, —PO$_3$H$_2$, —PO$_4$H$_2$, —SO$_3$H$_2$, CONHOH, acetylacetonate, deprotonated forms of the aforementioned, salts of said deprotonated forms, and chelating groups with Π-conducting character.

3. The sensitising dye of claim 1, wherein the compound of formula (a.1) is a compound of formula (IV) below:

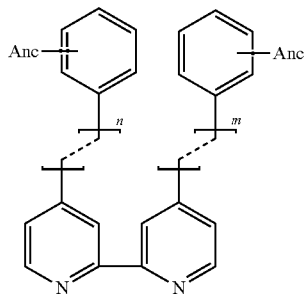
(IV)

wherein, the dotted line represents a carbon-carbon double or triple bond, n and m are, independently of each other, an integer selected from 1, 2, 3 or 4.

4. The sensitising dye of claim 2, wherein the compound of formula (II) is a compound of formula (IV) below:

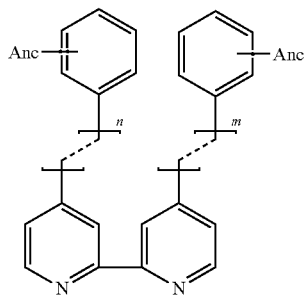
(IV)

wherein Anc is an anchoring group being attached by a single covalent bond to A, and being is selected from —COOH, —PO$_3$H$_2$, —PO$_4$H$_2$, —SO$_3$H$_2$, CONHOH, acetylacetonate, deprotonated forms of the aforementioned, salts of said deprotonated forms, and chelating groups with Π-conducting character.

5. The sensitising dye of claim 1, wherein the compound of formula (a.1) is a compound of formula (V):

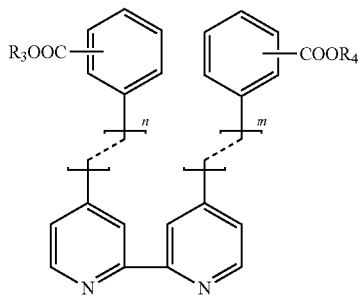
(V)

wherein R$_3$ and R$_4$ are selected, independently of each other, from H$^+$, an inorganic cation, and from an organic cation, and wherein n and m are, independently of each other, an integer selected from 1, 2, 3 or 4.

6. The sensitising dye of claim 1, wherein the compound of formula (a.1) is selected from any one of compounds of formulae (VII) and (VIII) below:

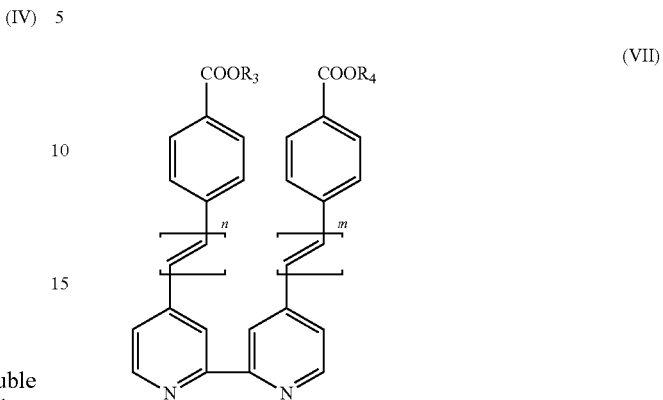
(VII)

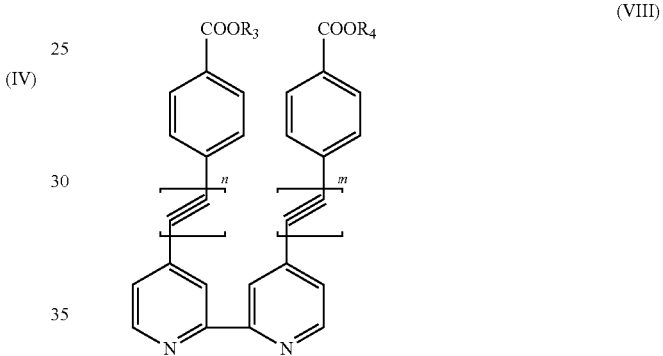
(VIII)

wherein n and m are, independently of each other, an integer selected from 1, 2, 3 or 4, and R$_3$ and R$_4$ are selected, independently of each other, from H$^+$, an inorganic cation, and from an organic cation.

7. The sensitising dye of claim 1, wherein the compound of formula (a.1) is selected from any one of compounds of formulae (XI) and (XII) below:

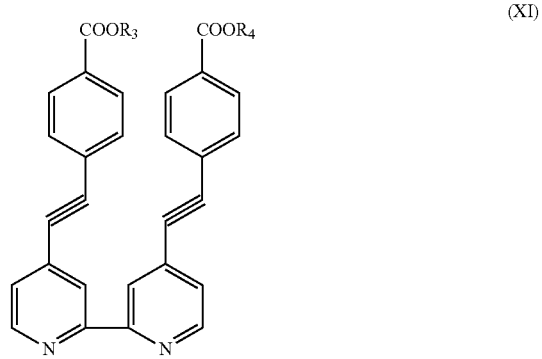
(XI)

-continued

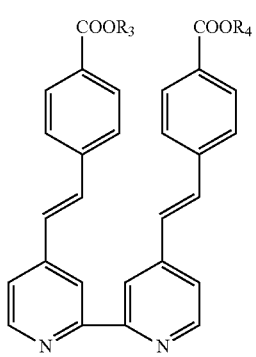
(XII)

wherein R₃ and R₄ are selected, independently of each other, from H⁺, an inorganic cation, and from an organic cation.

8. The sensitising dye of claim 2, wherein n is 1, and, if applicable, m is 1.

9. The sensitizing dye of claim 1, wherein at least one of $A_1$ and $R_{10}$ comprise an electron pair donating group.

10. The sensitising dye of claim 1, wherein the substituent -[A₁]ₜ-R₁₀ is selected from a substituent of formula (g) and (h) below:

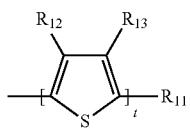
(g)

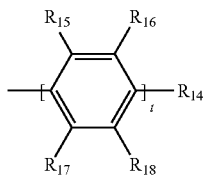
(h)

wherein:
  t is 0 or an integer from 1-3;
  $R_{11}$-$R_{13}$ are, independently one from the other(s) selected from H and C1-C10 hydrocarbon, said hydrocarbon being linear, branched or cyclic and optionally comprises one heteroatom, wherein $R_{12}$ and $R_{13}$ may be connected to form a ring fused to the thiophene ring;
  $R_{14}$-$R_{18}$ are, independently from one another, selected from H and C1-C10 hydrocarbon, said hydrocarbon being linear, branched or cyclic and optionally comprises one heteroatom.

11. The sensitising dye of claim 1, wherein R₅ and R₆ are, independently one from the other, selected from substituents of formulae (i), (j), and (k):

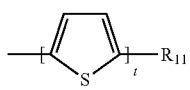
(i)

(j)

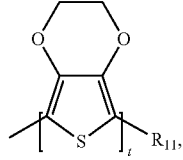
(k)

wherein $R_{11}$, and $R_{14}$ are, independently from one another, selected from H and C1-C10 hydrocarbon, said hydrocarbon being linear, branched or cyclic, and optionally comprises one heteroatom.

12. The sensitising dye of claim 1, wherein the ligand of formula (XX) is selected from any one of formulae (XXI), (XXII) and (XXIII) below:

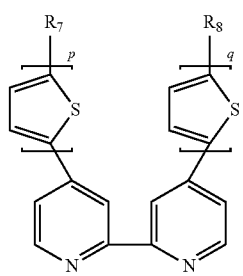
(XXI)

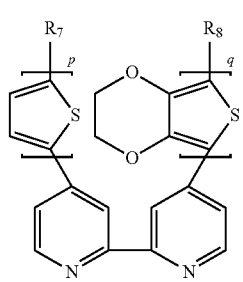
(XXII)

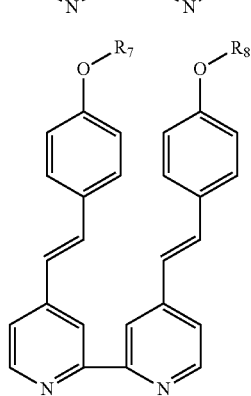
(XXIII)

wherein R₇ and R₈ are selected, independently one from the other, from and C1-C5 hydrocarbon.

13. A sensitizing dye of formula (XXV):

$$M(AL)(DL)(SL)_Y$$ (XXV)

wherein,

M is a metal selected from ruthenium, osmium, platinum, iron and copper;

AL is an anchoring ligand selected from compounds according to any one of formulae (a.1), (II), (IV), (V), (VII), (VIII), (XI), and (XII) below:

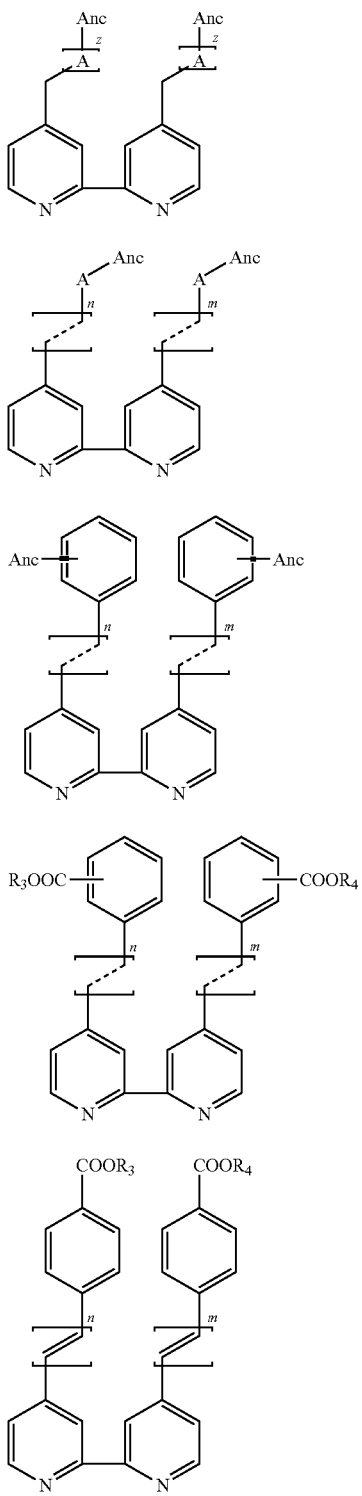

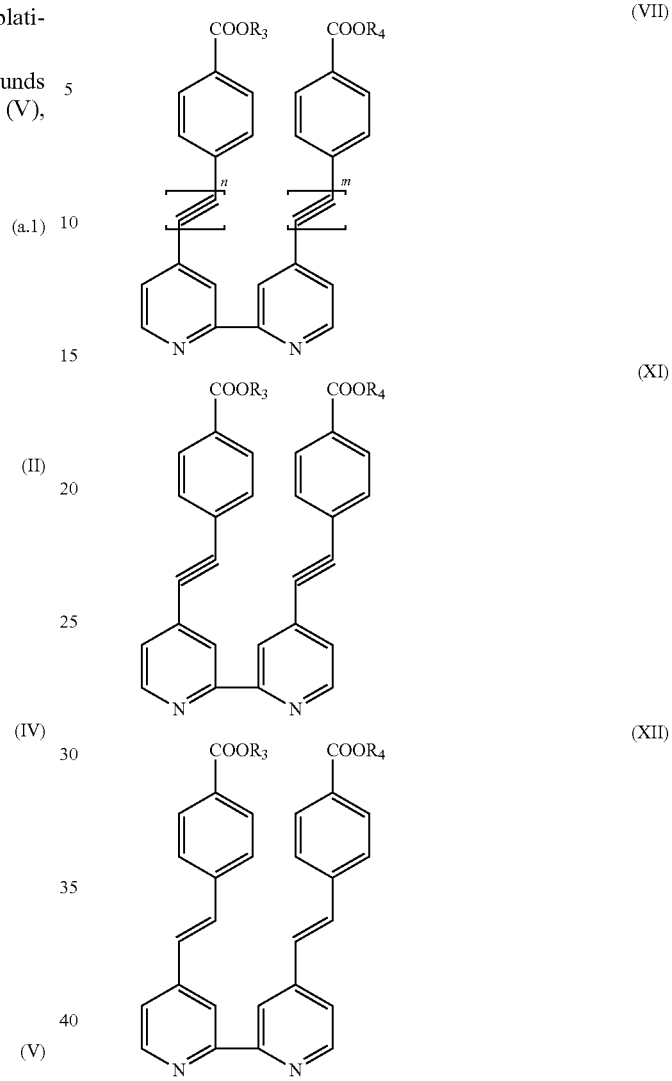

wherein Co of formula (a.1) is independently selected from (b) or (c):

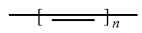

(b)

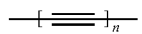

(c)

with n being independently an integer of 1-4;

wherein A is an aromatic moiety which is selected from a C6-C12 aromatic ring or ring system, said aromatic moiety optionally comprising one or more heteroatoms, and wherein said aromatic moiety may be further substituted in addition to -Anc;

wherein z is an integer selected from 1-3;

wherein Anc is an anchoring group being selected from —COOH, —PO$_3$H$_2$, —PO$_4$H$_2$, —SO$_3$H$_2$, CONHOH, acetylacetonate, deprotonated forms of the aforementioned, salts of said deprotonated forms, and chelating groups with Π-conducting character, said anchoring group being attached by a single covalent bond to A;

wherein, the dotted line in formulae (II), (IV) and (V) represents a carbon-carbon double or triple bond, wherein n and m of formulae (II), (IV) and (V) are, independently of each other, an integer selected from 1, 2, 3 or 4;

wherein $R_3$ and $R_4$ are selected, independently of each other, from $H^+$, an inorganic cation, and from an organic cation;

DL is a donor ligand selected from compounds according to any one of formulae (XX)-(XXIII) below

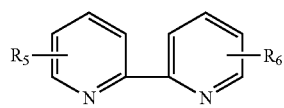
(XX)

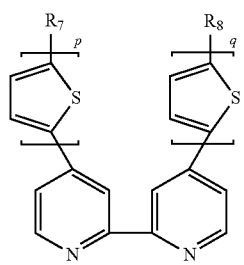
(XXI)

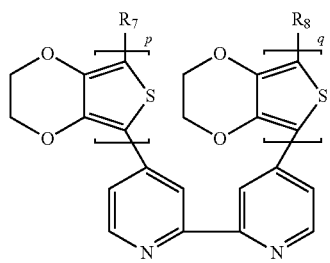
(XXII)

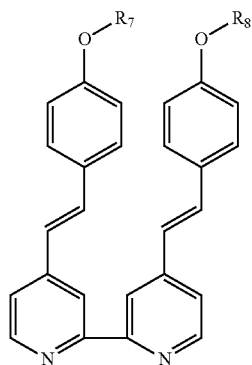
(XXIII)

wherein $R_5$ and $R_6$ are selected, independently one from the other, from substituents of formula (f) below:

(f)

r is 0, 1 or 2; t is 0 or an integer from 1-3, $A_1$ is a C4-C18 aromatic moiety, which, besides $R_{10}$, may be further substituted and which may comprise one or more heteroatoms, with the proviso that if $A_1$ is a C4 aromatic moiety, it comprises one or more heteroatoms; and, $R_{10}$ is H or a C1-C18 hydrocarbon;

with the proviso that only the C4 position of each pyridine ring of ligand of formula (XX) is substituted by $R_5$ and $R_6$, respectively;

wherein $R_7$ and $R_8$ are selected, independently one from the other, from H and C1-C5 hydrocarbon;

wherein y in formula (XXV) is 1 or 2; and wherein SL is a spectator ligand, which, with y being 2, are selected independently from two monodentate anionic ligands selected from $Cl^-$, $CNS^-$ and $CN^-$ and, with z being 1, is a bidentate monoanionic ligand selected from dithiocarbamate, acetylacetone, phenylpyridines of formula (XXX) below:

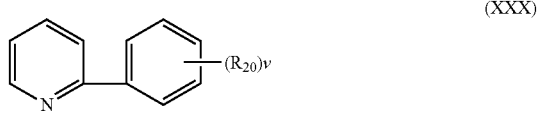
(XXX)

wherein $R_{20}$ represents a halogen atom and v is 0 or an integer of 1-3.

14. A photoelectric conversion device comprising a metal complex comprising a sensitising dye as defined in claim 1.

15. The photoelectric conversion device according to 14, which comprises a photoelectrode, a counter electrode and, between the photoelectrode and the counterelectrode, an electrolyte or a charge transporting material, and wherein a dye according to claim 1 is absorbed on the surface of the photoelectrode, on the side facing the counterelectrode.

* * * * *

UNITED STATES PATENT AND TRADEMARK OFFICE
CERTIFICATE OF CORRECTION

| | |
|---|---|
| PATENT NO. | : 8,962,977 B2 |
| APPLICATION NO. | : 12/998629 |
| DATED | : February 24, 2015 |
| INVENTOR(S) | : Mohammad Nazeeruddin et al. |

Page 1 of 1

It is certified that error appears in the above-identified patent and that said Letters Patent is hereby corrected as shown below:

In the Specification

• Column 6, line 24 the space between "an" and "organic" should be removed so that the specification recites "of organinc or anorganic" rather than "of organic or an organic".

• Column 11, line 66 is to recite "(XXI), (XXII) and (XXIII)" rather than "(XXI), (X) and (XOH)".

In the Claims

• Column 22, formula (XXII) in issued claim number 12 is to be illustrated as:

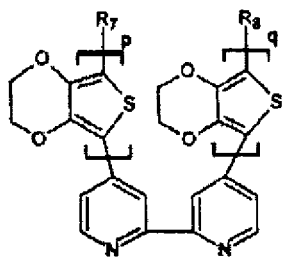

• Column 23, formula (a.1) in issued claim number 13 is to be illustrated as:

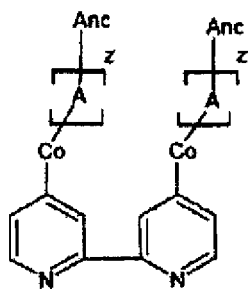

Signed and Sealed this
Twenty-sixth Day of May, 2015

Michelle K. Lee
*Director of the United States Patent and Trademark Office*